United States Patent [19]
Vinal et al.

[11] Patent Number: 5,438,007
[45] Date of Patent: Aug. 1, 1995

[54] METHOD OF FABRICATING FIELD EFFECT TRANSISTOR HAVING POLYCRYSTALLINE SILICON GATE JUNCTION

[75] Inventors: Albert W. Vinal, Cary; Michael W. Dennen, Raleigh, both of N.C.

[73] Assignee: Thunderbird Technologies, Inc., Research Triangle Park, N.C.

[21] Appl. No.: 127,767

[22] Filed: Sep. 28, 1993

Related U.S. Application Data

[62] Division of Ser. No. 87,509, Jul. 2, 1993, Pat. No. 5,371,396.

[51] Int. Cl.⁶ .................. H01L 21/265; H01L 21/44; H01L 21/48
[52] U.S. Cl. .................................. 437/41; 437/45; 437/191
[58] Field of Search ............... 437/41, 46, 191, 45; 257/412, 407, 756

[56] References Cited

U.S. PATENT DOCUMENTS

| | | | |
|---|---|---|---|
| 3,976,511 | 8/1976 | Johnson | 437/26 |
| 4,543,597 | 9/1985 | Shibata | 29/78 |
| 4,697,333 | 10/1987 | Nakahara | 437/20 |
| 4,745,079 | 5/1988 | Pfiester | 437/46 |
| 4,808,555 | 2/1989 | Mauntel et al. | 437/191 |
| 4,912,061 | 3/1990 | Nasr | 437/44 |
| 4,978,626 | 12/1990 | Poon et al. | 437/191 |
| 4,984,043 | 1/1991 | Vinal | 357/23.14 |
| 4,990,974 | 2/1991 | Vinal | 357/23.14 |
| 5,061,647 | 10/1991 | Roth et al. | 437/40 |
| 5,093,700 | 3/1992 | Sakata | 437/191 |
| 5,168,072 | 12/1992 | Moselehi | 437/41 |
| 5,185,279 | 2/1993 | Ushiku | 437/41 |
| 5,187,122 | 2/1993 | Bonis | 437/200 |
| 5,194,923 | 3/1993 | Vinal | 257/268 |
| 5,202,276 | 4/1993 | Malhi | 437/41 |
| 5,210,435 | 5/1993 | Roth et al. | 257/344 |
| 5,242,844 | 9/1993 | Hayashi | 437/40 |
| 5,244,823 | 9/1993 | Adan | 437/41 |
| 5,256,586 | 10/1993 | Choi et al. | 437/44 |
| 5,272,099 | 12/1993 | Chou et al. | 437/41 |
| 5,987,581 | 2/1992 | Rodder | 437/41 |

FOREIGN PATENT DOCUMENTS

| | | |
|---|---|---|
| 53-123682 | 10/1978 | Japan . |
| 4-102374 | 4/1992 | Japan . |
| 4154170 | 5/1992 | Japan . |

OTHER PUBLICATIONS

Chou, N. and J. Shepard, "Variable Threshold Field-Effect Transistor", IBM Technical Disclosure Bulletin, vol. 13, No. 6, Nov. 1970, pp. 1485.

*Device Design for the Submicrometer p-Channel FET with N+ Polysilicon Gate*, K. M. Cham et al., IEEE Transactions on Electron Devices, vol. ED-31, No. 7, Jul. 1984, pp. 964-968.

*A Novel p-n Junction Polycrystalline Silicon Gate MOSFET*, K. V. Anand et al., Int. J. Electronics, vol. 54, No. 2, 1983, pp. 287-298.

*Primary Examiner*—Olik Chaudhuri
*Assistant Examiner*—Brian K. Dutton
*Attorney, Agent, or Firm*—Bell, Seltzer, Park & Gibson

[57] ABSTRACT

A field effect transistor includes a polycrystalline silicon gate having a semiconductor junction therein. The semiconductor junction is formed of first and second oppositely doped polycrystalline silicon layers, and extends parallel to the substrate face. The polycrystalline silicon gate including the semiconductor junction therein is perfectly formed by implanting ions into the top of the polycrystalline silicon gate simultaneous with implantation of the source and drain regions. The semiconductor junction thus formed does not adversely impact the performance of the field effect transistor, and provides a low resistance ohmic gate contact. The gate need not be masked during source and drain implant, resulting in simplified fabrication.

7 Claims, 7 Drawing Sheets

METHOD OF FABRICATING FIELD EFFECT TRANSISTOR HAVING POLYCRYSTALLINE SILICON GATE JUNCTION

This application is a divisional of application Ser. No. 08/087,509, filed Jul. 2, 1993, now U.S. Pat. No. 5,371,396.

FIELD OF THE INVENTION

This invention relates to field effect transistor devices and fabrication methods and more particularly to field effect transistor devices which include polycrystalline silicon gates and methods of fabricating the same.

BACKGROUND OF THE INVENTION

Field effect transistors (FET) have become the dominant active device for very large scale integration (VLSI) and ultralarge scale integration (ULSI) applications, such as logic devices, memory devices and microprocessors, because the integrated circuit FET is by nature a high impedance, high density, low power device. Much research and development activity has focused on improving the speed and integration density of FETs, and on lowering the power consumption thereof.

Integrated circuit FETs are typically fabricated with a gate of polycrystalline silicon (also referred to as polysilicon). In some transistors, the polycrystalline silicon gate is counterdoped, i.e. doped of opposite conductivity from the source and drain regions of the FET. For example, U.S. Pat. Nos. 4,984,043 and 4,990,974, both by coinventor Albert W. Vinal and assigned to the assignee of the present application and both entitled *Fermi Threshold Field Effect Transistor*, the disclosures of which are hereby incorporated herein by reference, describe a field effect transistor which operates in the enhancement mode without requiring inversion by setting a device's threshold voltage to twice the Fermi potential of the semiconductor material. A polycrystalline silicon gate of opposite conductivity from the source and drain regions is preferably provided, in order to generate a gate contact potential which is equal and opposite to that of the substrate contact potential, thereby neutralizing the effect of the contact potentials. A Fermi threshold field effect transistor which includes a Fermi-Tub region surrounding the source and drain regions is described in U.S. Pat. No. 5,194,923 by coinventor Albert W. Vinal entitled *Fermi Threshold Field Effect Transistor With Reduced Gate and Diffusion Capacitance*, assigned to the assignee of the present invention, the disclosure of which is hereby incorporated herein by reference. Again, a polycrystalline silicon gate of opposite conductivity type from the source and drain regions is preferably provided.

A major problem in fabricating integrated circuit field effect transistors is masking the top of the polycrystalline silicon gate during source and drain implantation. It is difficult to form a mask on the gate without also masking the substrate face where the source and drain regions are to be implanted. Thus, complicated fabrication techniques have been devised for fabricating a gate cap to be used as a mask during source and drain implantations. Alternatively, counterdoped implants are required in the polycrystalline silicon gate, to counteract the effect of the doping ions accumulated therein as a result of source-drain implant.

Another problem in polycrystalline silicon gate field effect transistors is the contact between the polycrystalline silicon gate and the metal gate electrode thereon. It is desirable to have a low resistance ohmic contact between the metal gate electrode and the polycrystalline silicon gate. The contact should not behave as a Schottky barrier. Absent such a low resistance ohmic contact, device performance suffers.

SUMMARY OF THE INVENTION

It is therefore an object of the present invention to provide an improved method of fabricating a field effect transistor, and transistors so fabricated.

It is another object of the present invention to provide a field effect transistor which obviates the need to mask the gate during source and drain implantation, and methods of fabricating same.

It is still another object of the present invention to provide a polycrystalline silicon gate FET including a low resistance ohmic contact between the polycrystalline silicon gate and the gate electrode, and methods of fabricating same.

These and other objects are provided, according to the present invention, by forming a polycrystalline silicon gate of first conductivity type on an insulating layer on a semiconductor substrate. A portion of the polycrystalline silicon gate opposite the insulating layer, and portions of the semiconductor substrate adjacent opposing ends of the polycrystalline silicon gate, are simultaneously doped a second conductivity type. Thus, a semiconductor junction is formed in the polycrystalline silicon gate during formation of the spaced apart source and drain regions in the substrate, at the respective opposite ends of the polycrystalline silicon gate.

According to the invention, the top of the polycrystalline silicon gate is doped the second conductivity type, simultaneous with the doping of the source and drain regions. It has been found, according to the invention, that the semiconductor junction thus formed in the polycrystalline silicon gate does not adversely impact the performance of the field effect transistor. In particular, it has been found that the contact potential of the gate with the semiconductor junction therein is identical to the contact potential of the gate without the semiconductor junction therein. Moreover, since the source and drain regions are typically heavily doped, a heavily doped region of second conductivity type is simultaneously formed in the gate. Thus, a low resistance ohmic contact is formed with the metal gate electrode. Accordingly, a high performance polycrystalline silicon gate field effect transistor is provided which can be fabricated without masking the gate.

A field effect transistor according to the present invention includes a semiconductor substrate of first conductivity type, and spaced apart source and drain regions of second conductivity type in the semiconductor substrate at a face thereof. The field effect transistor also includes an insulating layer on the substrate face between the spaced apart source and drain regions. The field effect transistor also includes a first polycrystalline silicon layer of the first conductivity type, on the insulating layer opposite the substrate face, and a second polycrystalline silicon layer of the second conductivity type, on the first polycrystalline silicon layer opposite the insulating layer. The first and second polycrystalline silicon layers define a semiconductor junction therebetween extending parallel to the substrate face. Source, drain and gate electrodes electrically contact the source region, drain region and the second polycrystalline silicon layer, respectively. The second polycrystalline silicon layer is relatively highly doped compared to the first polycrystalline silicon layer to thereby form a low resistance ohmic contact with the gate electrode.

The polycrystalline silicon gate junction may be included in any field effect transistor which includes a polycrystalline silicon gate, in order to simplify fabrication thereof and provide a low resistance ohmic contact between the polycrystalline silicon gate and the gate electrode. The polycrystalline silicon gate junction is preferably used in a Fermi threshold field effect transistor, with or without a Fermi-Tub, such as described in the aforesaid U.S. patents and related pending patent applications, to enhance the performance and simplify fabrication thereof.

DESCRIPTION OF PREFERRED EMBODIMENTS

Figure 1:
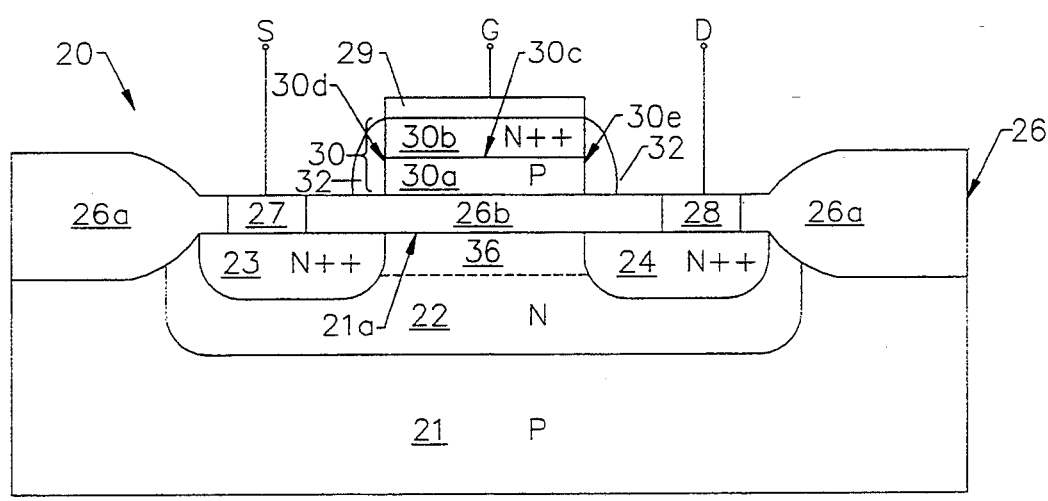
FIG. 1 illustrates a cross sectional view of a field effect transistor including a polycrystalline silicon gate junction according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Referring now to FIG. 1, an N-channel field effect transistor including a polycrystalline silicon gate junction according to the present invention is illustrated. Although FIG. 1 illustrates a low capacitance Fermi threshold field effect transistor, as described in U.S. Pat. No. 5,194,923, it will be understood by those having skill in the art that the present invention can be used with the Fermi threshold field effect transistors of U.S. Pat. Nos. 4,984,043 and 4,990,974, with other Fermi threshold field effect transistors, and with conventional insulated gate and buried channel field effect transistors as well.

Referring now to FIG. 1, an N-channel low capacitance Fermi FET 20 is illustrated. It will be understood by those having skill in the art that a P-channel Fermi FET may be obtained by reversing the conductivities of the N- and P-regions.

As illustrated in FIG. 1, FET 20 is fabricated in a semiconductor substrate 21 of first conductivity type, here P-type, and including a substrate face 21a. A Fermi-Tub region 22 of second conductivity type, here N-type, is formed in the substrate 21 at substrate face 21a. Spaced apart source and drain regions 23 and 24, respectively, of second conductivity type, here N-type, are formed in the Fermi-Tub region 22 at the substrate face 21a. It will be understood by those having skill in the art that the source and drain regions may also be formed in a trench in the substrate face 21a. A Fermi channel region 36 is formed in Fermi-Tub 22 between source 23 and drain 24. As described in the above cited patents to Vinal, at least the depth of the Fermi channel may be selected to produce zero vertical static electrical field across the channel 36 and at the substrate face 21a adjacent channel 36. In the '974 and '043 patents the depth of the Fermi channel is referred to as $Y_o$. In the '923 patent it is referred to as $Y_f$.

Still referring to FIG. 1, a conventional insulating layer 26 is formed on substrate 21 at substrate face 21a. Insulating layer 26 typically includes field insulating regions 26a which are relatively thick (for example, between about 0.5 μm and 1.0 μm) and a gate insulating region 26b which is typically relatively thin (for example between about 50 Å and 300 Å). It will be understood by those having skill in the art that insulating layer 26 is typically formed of silicon dioxide although many other materials may be used.

Still referring to FIG. 1, a polycrystalline silicon (polysilicon) gate 30 is formed on gate insulating region 26b opposite face 21a. According to the invention, polycrystalline silicon gate 30 is formed of two oppositely doped polycrystalline silicon layers. First polycrystalline silicon layer 30a is formed on gate insulating region 26b opposite face 21a and is doped the first conductivity type, here P-type. Second polycrystalline silicon layer 30b is formed on first polycrystalline silicon layer 30a, opposite insulating layer 26b. Second polycrystalline silicon layer 30b is doped the second conductivity type, here N-type.

As shown in FIG. 1, the source region 23, drain region 24 and second polycrystalline silicon layer 30b are all doped the same conductivity type. Moreover, because these regions are all formed using a single implant, as described below, they all have the same doping concentration, designated N++ in FIG. 1. Thus, second polycrystalline silicon layer 30b is relatively heavily doped compared to first polycrystalline silicon layer 30a. Relatively heavily doped second polycrystalline silicon layer 30b forms a low resistance ohmic contact with gate electrode 29.

Source electrode 27 and drain electrode 28 form low resistance ohmic contacts to source region and drain region 23 and 24 respectively. FET 20 also typically includes sidewall spacers 32 formed of silicon dioxide, silicon nitride, combinations thereof, or other insulators, for isolating opposing ends 30d, 30e of polycrystalline silicon gate 30 from the remainder of the device.

Figure 2A:
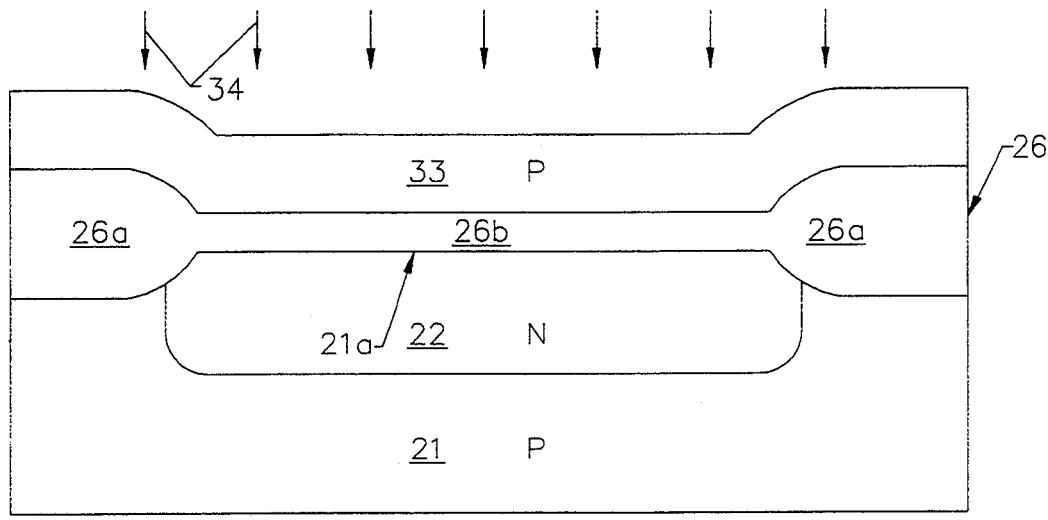
FIGS. 2A–2C illustrate the transistor of FIG. 1 during intermediate fabrication steps.
Figure 2B:
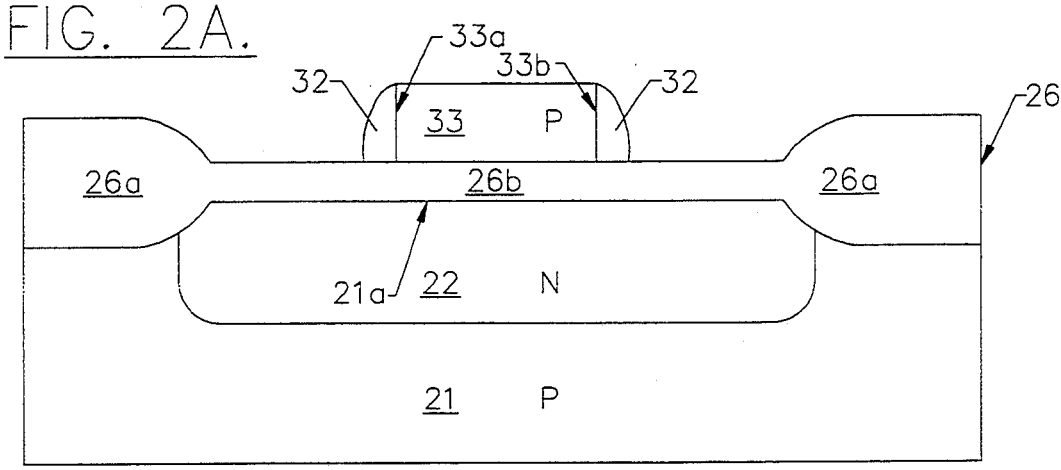
Figure 2C:
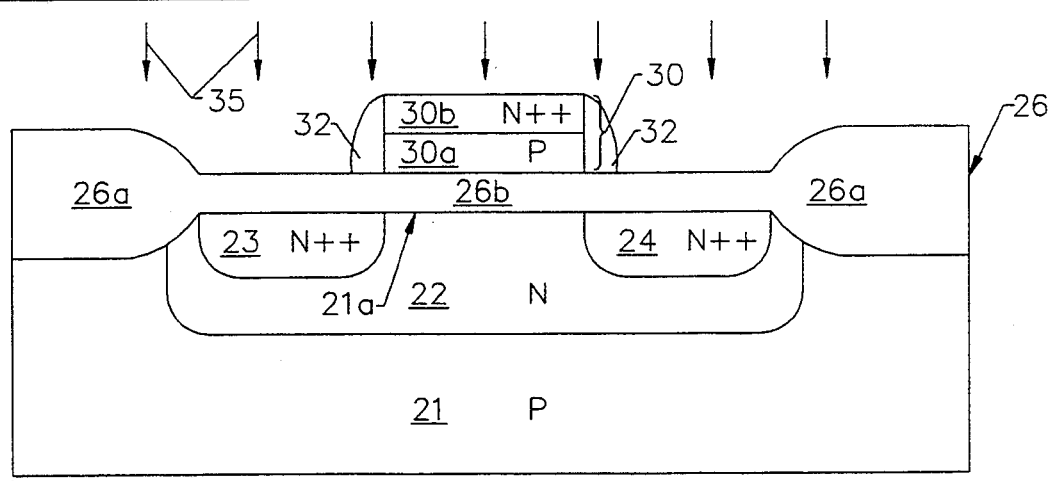

Referring now to FIGS. 2A–2C, a method for fabricating the field effect transistor 20 of FIG. 1 will now be described. As illustrated in FIG. 2A, the field effect transistor is formed by providing a semiconductor substrate 21 having an insulating region 26 on a face 21a thereof. Relatively thick and relatively thin portions 26a and 26b, respectively, of insulating layer 26, may be formed using conventional techniques. If a Fermi-FET including a Fermi-Tub is being formed, a Fermi-Tub 22 may also be formed in the semiconductor substrate between adjacent relatively thick portions 26a of insulating layer 26.

Still referring to FIG. 2A, a polycrystalline silicon layer 33, typically between about 1,000 and 10,000 Å thick, is formed on insulating layer 26. Then, as shown in FIG. 2A, ions of first conductivity type are implanted in polycrystalline silicon layer 33 in the direction shown by arrows 34 to form a doped polycrystalline silicon layer. Preferred doping concentration and profiles will be described below. Multiple implants may be used. It will also be understood by those having skill in the art that polycrystalline silicon layer 33 may be formed by in situ doping rather than by ion implantation, or by using other conventional techniques.

Referring now to FIG. 2B, polycrystalline silicon layer 33 is patterned, using conventional masking and etching techniques, and sidewall spacers 32 are formed at opposing ends 33a, 33b of the patterned polycrystalline silicon layer 33. The formation of sidewall spacers 32 are well known to those having skill in the art and need not be described further herein.

Referring now to FIG. 2C, implantation of ions of second conductivity type in the direction shown by arrows 35 is performed to provide source and drain regions 23 and 24 and second conductivity doping type to polycrystalline silicon gate region 30b. Multiple implants may be used. It will be understood by those having skill in the art that diffusion or other conventional techniques may also be used rather than ion implantation. According to the invention, polycrystalline silicon layer 33 does not include a mask or cap on the top thereof. Rather, the top of polycrystalline silicon layer 33 remains unmasked so that the ions 35 implant into layer 33. Thus, a first polycrystalline silicon layer 30a of first conductivity type and a second polycrystalline silicon layer 30b of second conductivity type are formed, with a semiconductor junction 30c therebetween, extending generally parallel to substrate face 21a.

As also shown in FIG. 2C, simultaneous with formation of region 30b in the polycrystalline silicon gate 33, source 23 and drain 24 are also formed at opposing ends 33a, 33b of polycrystalline silicon gate 33, respectively. Since the source 23, drain 24 and second polycrystalline silicon layer 30b are all formed in a single implant or diffusion step, they are all of the same conductivity type and all are of the same doping concentration. Moreover, since these implant produces a relatively high doping concentration, compared to first polycrystalline silicon layer 30a, a low resistance ohmic contact is formed. The structure of FIG. 2C is then metallized using conventional techniques to form the structure of FIG. 1.

It will now be shown that the total contact potential (also referred to as "flat-band voltage") due to metal gate electrode 29 contact to the polycrystalline silicon gate 30 including a semiconductor junction 30c therein, is identical to a metal gate contact to a conventional uniformly doped polycrystalline silicon gate. In particular, for a conventional uniformly doped polycrystalline silicon gate, the flat-band gate voltage $V_{fbg}$ developed between the metal gate contact and a P-type polycrystalline silicon gate at the interface between the gate oxide and the polycrystalline silicon gate is:

$$V_{fbg} = \frac{KT}{q} \ln\left(\frac{N^* N_{as}}{N_i^2}\right) \tag{1}$$

Where:
K is $1.38 \times 10^{-23}$ Joules/°Kelvin;
T is temperature in degrees Kelvin;
q is $1.6 \times 10^{-19}$ coulombs;
N* is the effective concentration of electrons within the bottom edge of the metal conduction band;
$N_{as}$ is the acceptor concentration within the polycrystalline silicon gate at the insulating layer-gate interface; and
$N_i$ is the intrinsic carrier concentration of the polycrystalline silicon gate material.

According to the invention, the flat-band voltage developed between the metal gate contact 29 and the P-type polycrystalline silicon layer 30a at the interface with the gate insulating layer 26b is:

$$V_{fbg} = \frac{KT}{q} \ln\left(\frac{N^*}{N_d^+ +}\right) + \frac{KT}{q} \ln\left(\frac{N_d^+ + N_{as}}{N_i^2}\right) = \tag{2}$$

$$\frac{KT}{q} \ln\left(\frac{N^* N_{as}}{N_i^2}\right)$$

Where $N_d^+$ is the donor concentration in layer 30b.

Accordingly, the gate contact flat-band voltage is identical for a gate including a junction according to the present invention and contact to a conventional polycrystalline silicon gate. Equations (3) and (4) are analogous to Equations (1) and (2) for a field effect transistor of opposite conductivity type from that shown in FIG. 1:

$$V_{fbg} = \frac{KT}{q} \ln\left(\frac{N^*}{N_{ds}^-}\right) \tag{3}$$

$$V_{fbg} = \frac{KT}{q} \ln\left(\frac{N^* N_a^{++}}{N_i^2}\right) - \frac{KT}{q} \ln\left(\frac{N_{ds}^- N_a^{++}}{N_i^2}\right) = \tag{4}$$

$$\frac{KT}{q} \ln\left(\frac{N^*}{N_{ds}^-}\right)$$

Where $N_{ds}^-$ is the donor concentration within the polycrystalline silicon gate at the interface with the insulating layer.

Preferably, the thickness of the polycrystalline silicon gate 30 is a approximately twice the depth of the drain and source regions 23, 24. The thickness $Y_j$ of the depletion region at the P-N junction 30c is very thin, approximately 100 Å, and is described by Equation (5). Since the depletion region is so thin, it has minimal effect on determining the thickness of the polycrystalline silicon gate.

$$Y_j = \sqrt{\frac{2e_s \frac{KT}{q} \ln\left(\frac{N_{pol} N_{dif}}{N_i^2}\right)}{q N_{pol}} \left(\frac{N_{dif} + N_{pol}}{N_{dif}}\right)} \tag{5}$$

Where:
$e_s$ is the permittivity of channel 36
$N_{pol}$ is the gate concentration at the insulating layer interface;
$N_{dif}$ is the gate concentration in region 30b.

Figure 3A:
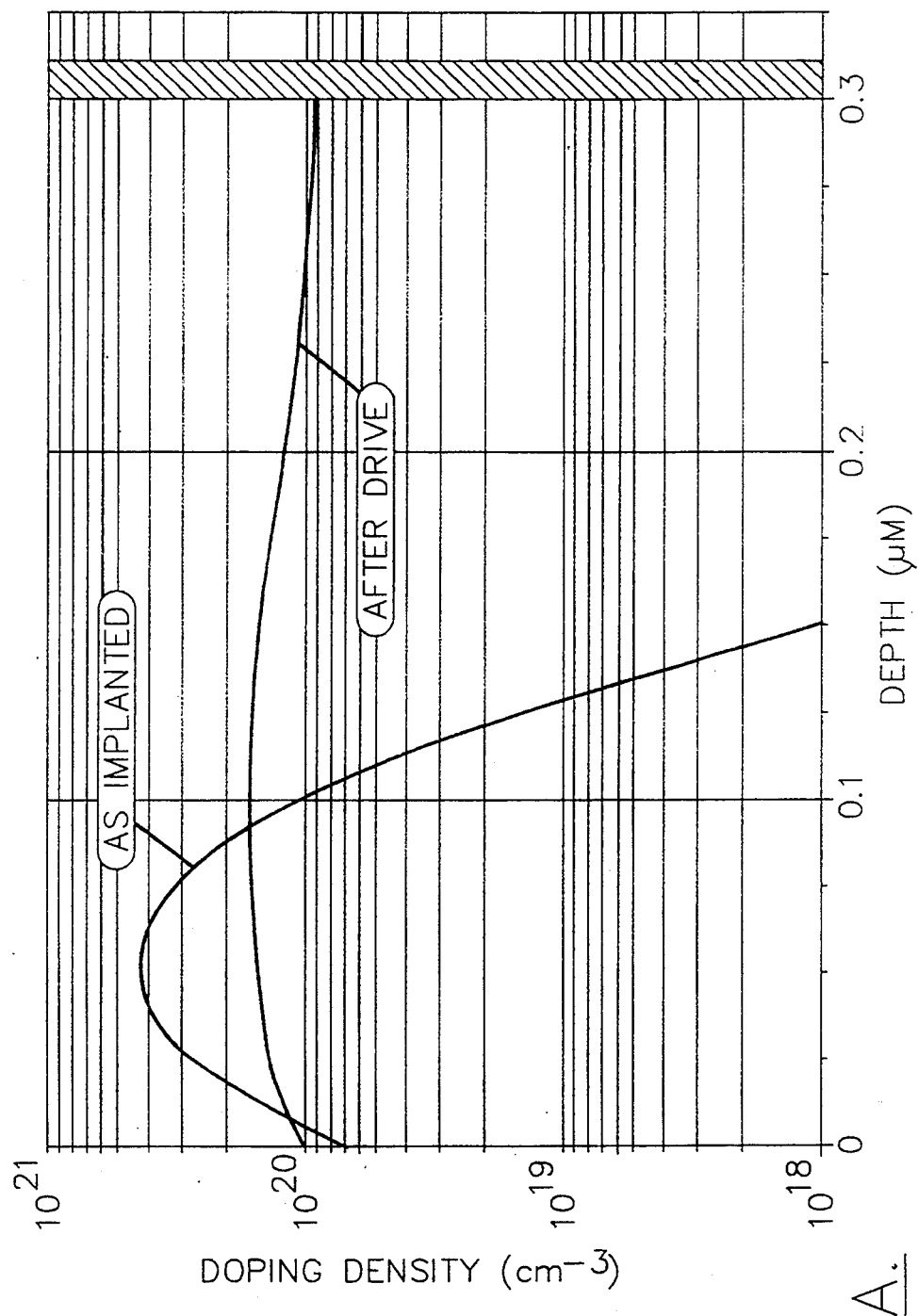
FIGS. 3A and 3B illustrate a polycrystalline silicon P-doping profile for an N-channel Fermi-FET before and after anneal without the polycrystalline silicon gate junction of the present invention, and a P-doping profile before and after anneal for use with a polycrystalline silicon gate junction of the present invention, respectively.
Figure 3B:
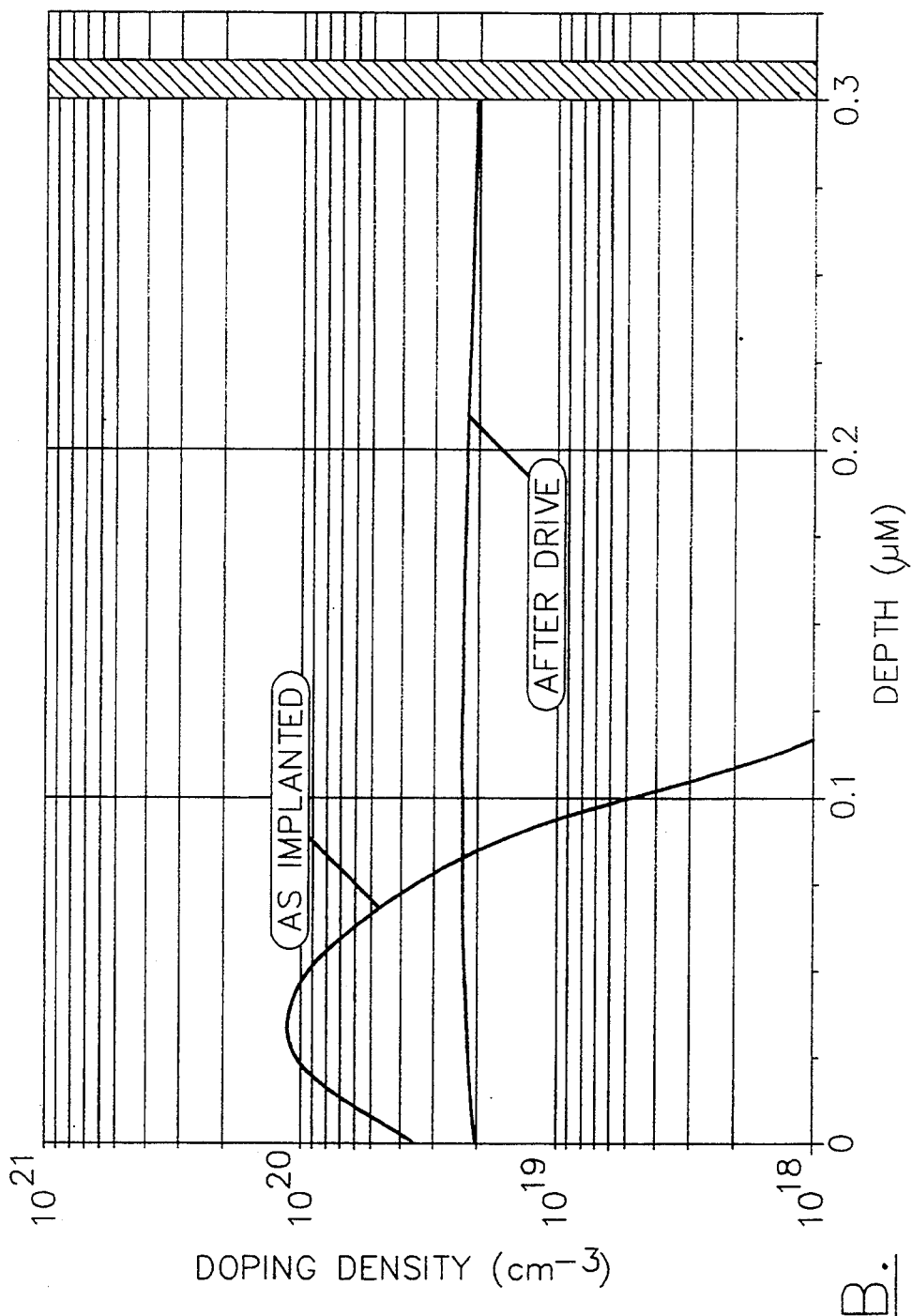

Referring again to FIG. 2A, ions 34 may be boron in sufficient quantity to result in a desired concentration at the interface between polycrystalline layer 31 an gate insulator 26b at the end of the processing sequence of FIG. 2C. FIG. 3A illustrates a P-type polycrystalline silicon doping profile for an N-channel Fermi-FET without incorporating the polycrystalline silicon gate junction of the present invention. FIG. 3B depicts a similar device which will incorporate a polycrystalline silicon gate junction. The presence of a polycrystalline silicon gate junction 30c (not shown in FIG. 3B) allows a much lower initial dose for the boron implant 34, and a somewhat longer drive-in anneal. The concentration at the polysilicon-gate 30—insulator 26b interface is initially set to the desired final concentration when using the polycrystalline silicon gate junction technique. Otherwise the initial polycrystalline silicon gate implant concentration must be set to several times the desired final level shown in FIG. 3A to counteract the effects of the diffusion implant.

Figure 4A:
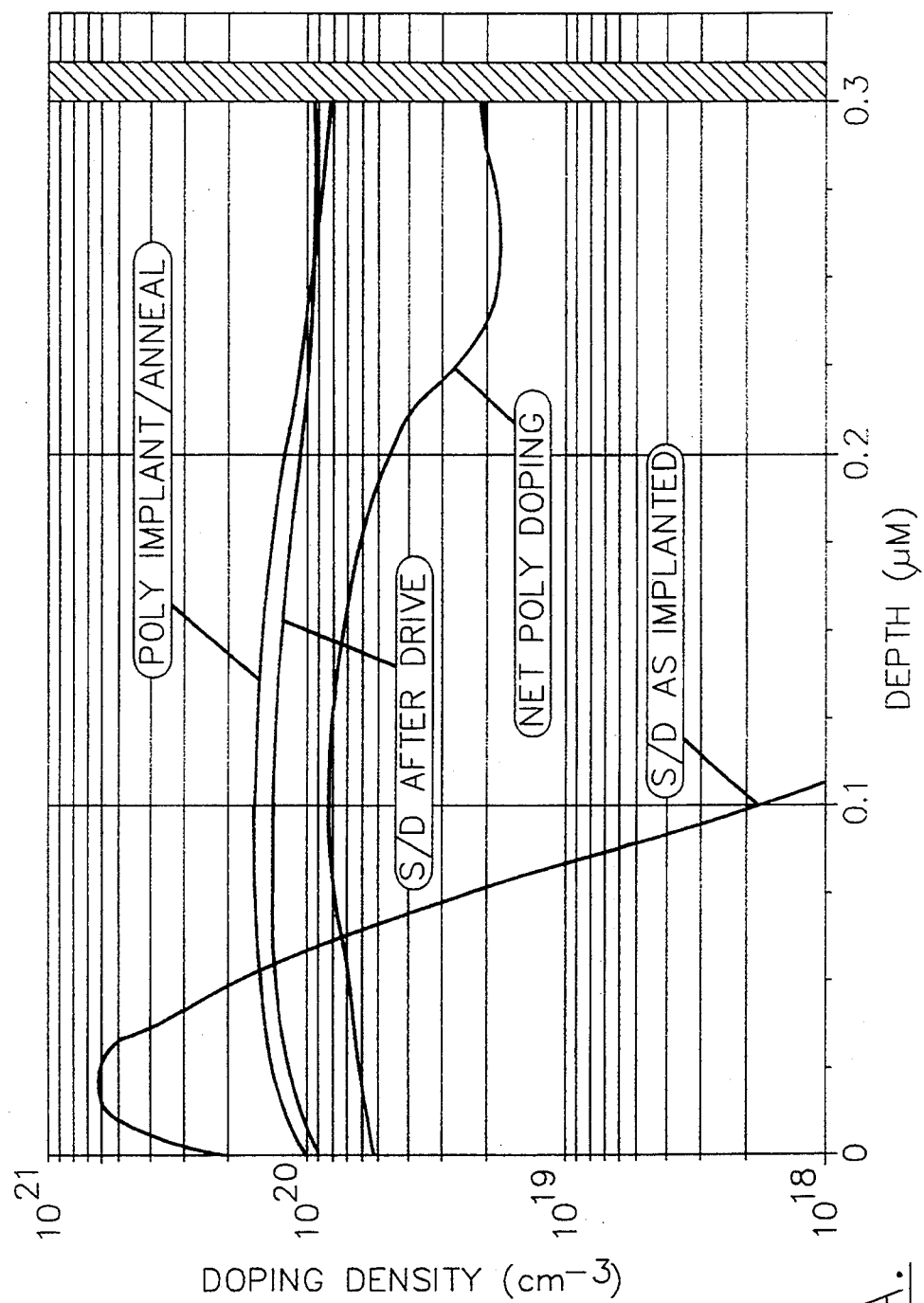
FIGS. 4A and 4B illustrate a composite polycrystalline silicon doping profile during source/drain implant and subsequent anneal for an N-channel Fermi-FET without a polycrystalline silicon gate junction according to the present invention, and with a polycrystalline silicon gate junction according to the present invention, respectively.
Figure 4B:
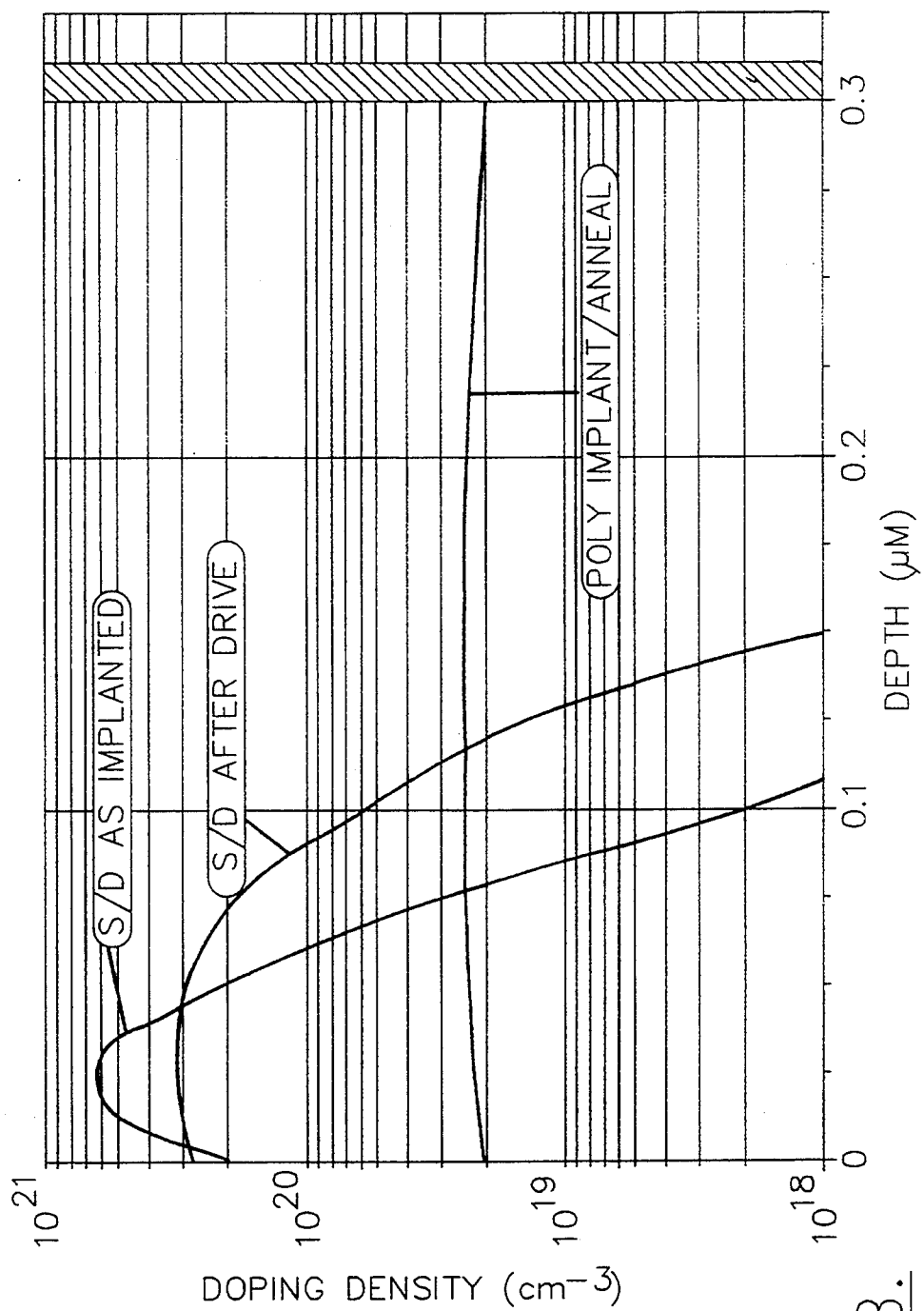
Figure 5:
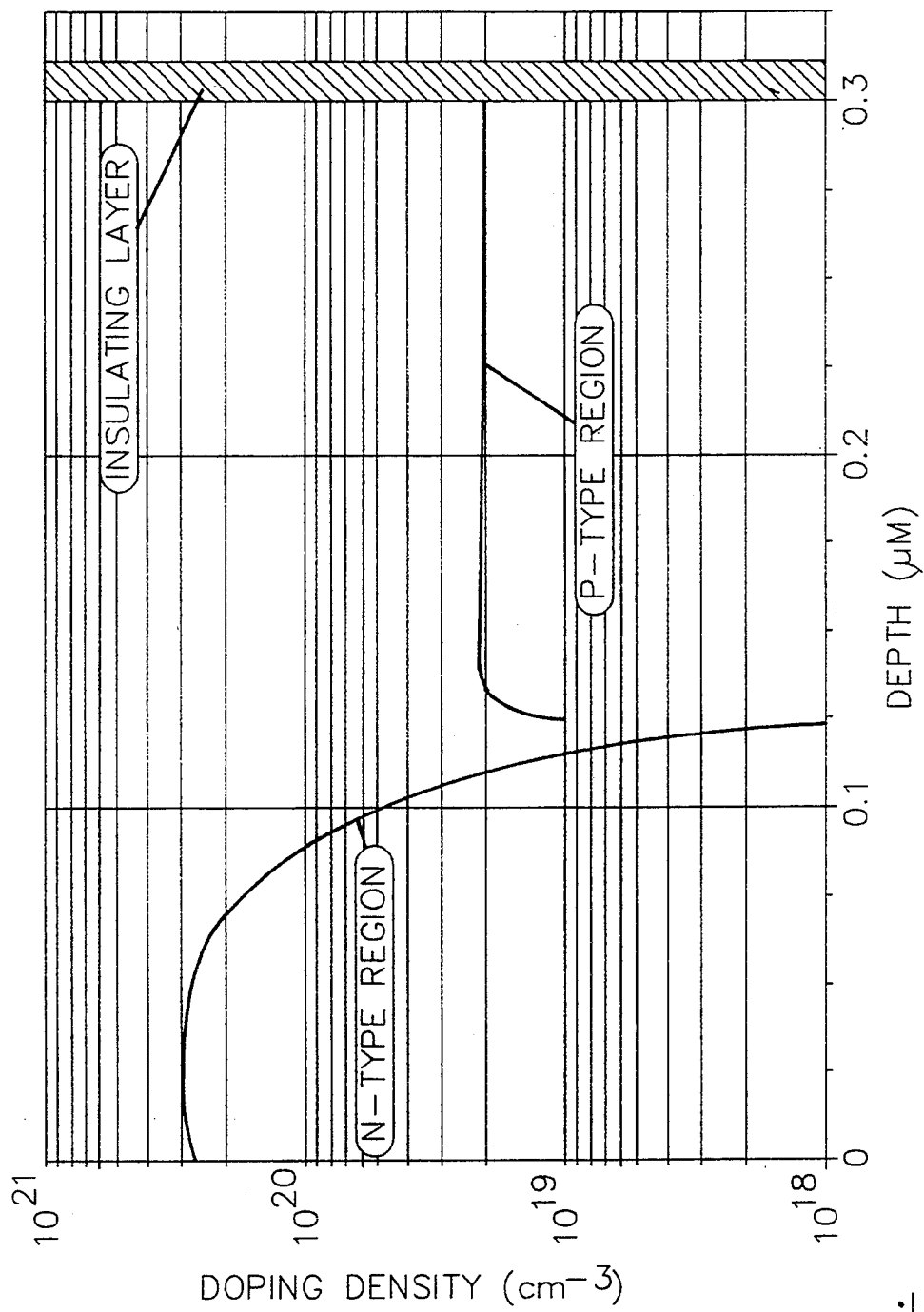
FIG. 5 graphically illustrates a final doping profile for a polycrystalline silicon gate according to the present invention.

FIGS. 4A and 4B illustrate both phases of polycrystalline silicon doping during the source-drain implant and subsequent anneal for a Fermi-FET without a gate junction and for a Fermi-FET with a gate junction, respectively. The polycrystalline silicon gate 30 itself is used to form the self-aligned source and drain regions 23, 24 by implanting with a high dose N-type implant 35 of low enough energy so as not to penetrate through the polycrystalline silicon gate structure. The final doping profile for the polycrystalline silicon gate 30 of FIG. 1 is illustrated in FIG. 5.

It will be understood by those having skill in the art that the semiconductor junction 30c introduces capacitance, and therefore adds an additional gate capacitance factor that should be considered in determining channel conduction during the rise and fall time of gate voltage. This additional junction decreases the net gate capacitance by a negligible amount as will now be shown. An expression for the gate capacitance is:

$$C_g^* = \frac{1}{\frac{1}{C_{ox}^*} + \frac{1}{C_{ch}^*} + \frac{1}{C_{pj}^*}} \quad (6)$$

For typical designs, the polycrystalline silicon gate junction capacitance, $C_{pj}^*$, F/cm², should be at least one order of magnitude greater than the net series capacitance, $C_g^*$, of the gate insulator $C_{ox}^*$ and channel capacitance $C_{ch}^*$ due to carrier flow depth $\delta$.

$$C_{pj}^* \geq 10 \frac{C_{ox}^* C_{ch}^*}{C_{ox}^* + C_{ch}^*} \quad (7)$$

Where;
$C_{ox}^* = e_i/T_{ox}$
$C_{ch}^* = 2e_s/\delta$
$e_i$ = permittivity of gate insulator 26b
$T_{ox}$ = thickness of gate insulator 26b
$e_s$ = permittivity of channel 36
$\delta$ = carrier flow depth $$C_{pj}^* = \sqrt{\frac{2e_g q N_{do}}{\frac{KT}{q} \ln\left(\frac{N_{pol} N_{do}}{N_i^2}\right)} \left(\frac{N_{pol}}{N_{do} + N_{pol}}\right)} \quad (8)$$

$N_{do}$ = doping concentration; i.e. at the top of the polycrystalline silicon gate region 30b.
$N_{pol}$ = gate doping concentration at the insulator interface 21a.
$N_i$ = Intrinsic carrier concentration of the polycrystalline silicon gate.
$e_g$ = permittivity of polysilicon gate regions 30a and 30b.

The required gate voltage coupling efficiency $G_e$ is defined below.

$$G_e = \frac{C_{pj}^*}{C_{pj}^* + C_g^*} > 0.9 \text{ at high speed} \quad (9)$$

Accordingly, the presence of junction 30c has little effect on diminishing the electrical signal voltage coupled through the insulator 26b to the channel surface 21a during a gate signal voltage rise or fall time.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming a field effect transistor comprising the steps of:
   providing a semiconductor substrate having an insulating layer on a face thereof;
   forming a single polycrystalline silicon layer of first conductivity type on said insulating layer, said single polycrystalline silicon layer including a pair of opposing ends;
   simultaneously doping a portion of said single polycrystalline silicon layer, and portions of said semiconductor substrate adjacent said pair of opposing ends, with dopant ions of a second conductivity type, to simultaneously form a semiconductor junction in said single polycrystalline silicon layer extending parallel to said substrate face, and spaced apart source and drain regions in said substrate at said opposing ends of said single polycrystalline silicon layer.

2. The method of claim 1 wherein said forming step comprises the steps of:
   forming said single polycrystalline silicon layer on said insulating layer; and
   patterning said single polycrystalline silicon layer to form said pair of opposing ends.

3. The method of claim 1 wherein said simultaneously doping step comprises the step of directing ions of said second conductivity type towards said substrate face.

4. The method of claim 3 wherein said single polycrystalline silicon layer is free of a masking layer thereon, during said simultaneously doping step, such that said ions of said second conductivity type enter into said single polycrystalline silicon layer.

5. The method of claim 1 wherein said insulating layer comprises a field oxide portion and a gate oxide portion, and wherein said single polycrystalline silicon layer is formed on said gate oxide portion.

6. The method of claim 1 wherein said single polycrystalline silicon layer forming step is preceded by the step of forming a well of said second conductivity type in said semiconductor substrate, at said substrate face, and wherein said single polycrystalline layer forming step comprises the step of forming said single polycrystalline silicon layer on said insulating layer such that said well extends beyond said first and second opposing ends at said substrate face.

7. The method of claim 1 further comprising the step of forming electrical contacts to said source and drain regions and to said single polycrystalline silicon layer.

* * * * *